(12) United States Patent
Kim et al.

(10) Patent No.: US 10,734,465 B2
(45) Date of Patent: Aug. 4, 2020

(54) DISPLAY DEVICE

(71) Applicant: Samsung Display Co., Ltd., Yongin-Si, Gyeonggi-Do (KR)

(72) Inventors: Il Joo Kim, Yongin-si (KR); Cheol Gon Lee, Yongin-si (KR); Mee Hye Jung, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 16/289,283

(22) Filed: Feb. 28, 2019

(65) Prior Publication Data

US 2019/0198597 A1   Jun. 27, 2019

Related U.S. Application Data

(63) Continuation of application No. 15/816,224, filed on Nov. 17, 2017, now Pat. No. 10,249,696.

(30) Foreign Application Priority Data

Nov. 21, 2016 (KR) .................. 10-2016-0155155

(51) Int. Cl.
| H01L 27/14 | (2006.01) |
| H01L 27/32 | (2006.01) |
| H01L 29/786 | (2006.01) |
| H01L 27/12 | (2006.01) |
| G09G 3/32 | (2016.01) |
| G09G 3/3225 | (2016.01) |
| G09G 3/3233 | (2016.01) |

(52) U.S. Cl.
CPC ........... H01L 27/3272 (2013.01); G09G 3/32 (2013.01); G09G 3/3225 (2013.01); G09G 3/3233 (2013.01); H01L 27/124 (2013.01); H01L 27/1255 (2013.01); H01L 27/3262 (2013.01); H01L 27/3265 (2013.01); H01L 27/3276 (2013.01); H01L 29/78633 (2013.01); G09G 2300/0426 (2013.01); G09G 2300/0819 (2013.01); G09G 2300/0842 (2013.01)

(58) Field of Classification Search
CPC ............... H01L 27/124; H01L 27/1255; H01L 27/3262; H01L 27/3265
USPC .............................................. 257/71, 59, 72
See application file for complete search history.

(56) References Cited

U.S. PATENT DOCUMENTS

| 8,698,189 | B2 | 4/2014 | Park et al. |
| 2006/0246360 | A1 | 11/2006 | Hwang |
| 2016/0141349 | A1* | 5/2016 | Yun ..................... H01L 27/3272 257/40 |

* cited by examiner

Primary Examiner — Tan N Tran
(74) Attorney, Agent, or Firm — Innovation Counsel LLP

(57) ABSTRACT

A display device includes: a substrate; a plurality of pixels provided in a pixel region of the substrate; a scan line and a data line, connected to each of the plurality of pixels; a first transistor connected to the scan line and the data line and a second transistor connected to the first transistor; a light emitting element connected to the transistor; a first blocking layer disposed between the substrate and the first transistor, the first blocking layer being electrically connected to the first transistor; and a second blocking layer disposed between the substrate and the second transistor, the second blocking layer being electrically connected to the second transistor, wherein the first blocking layer is connected to a gate electrode of the first transistor, and the second blocking layer is connected to any one of source and drain electrodes of the second transistor.

19 Claims, 16 Drawing Sheets

FIG. 7A
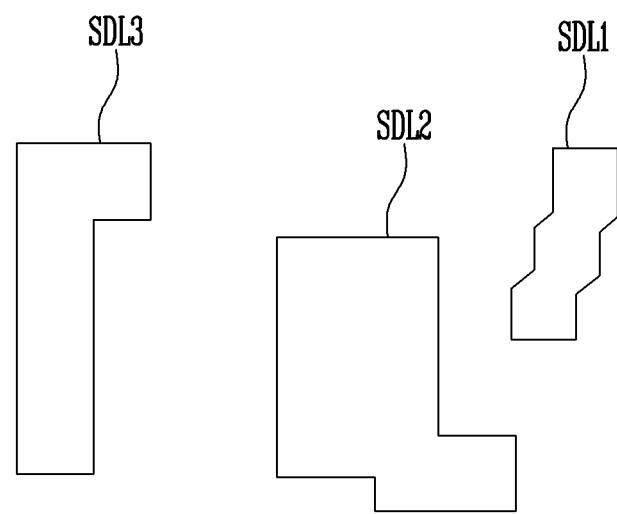
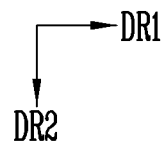

FIG. 7B
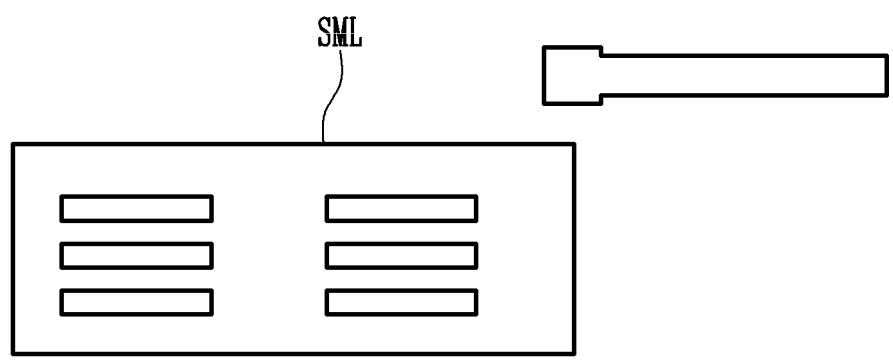
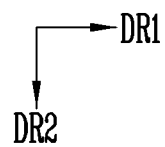

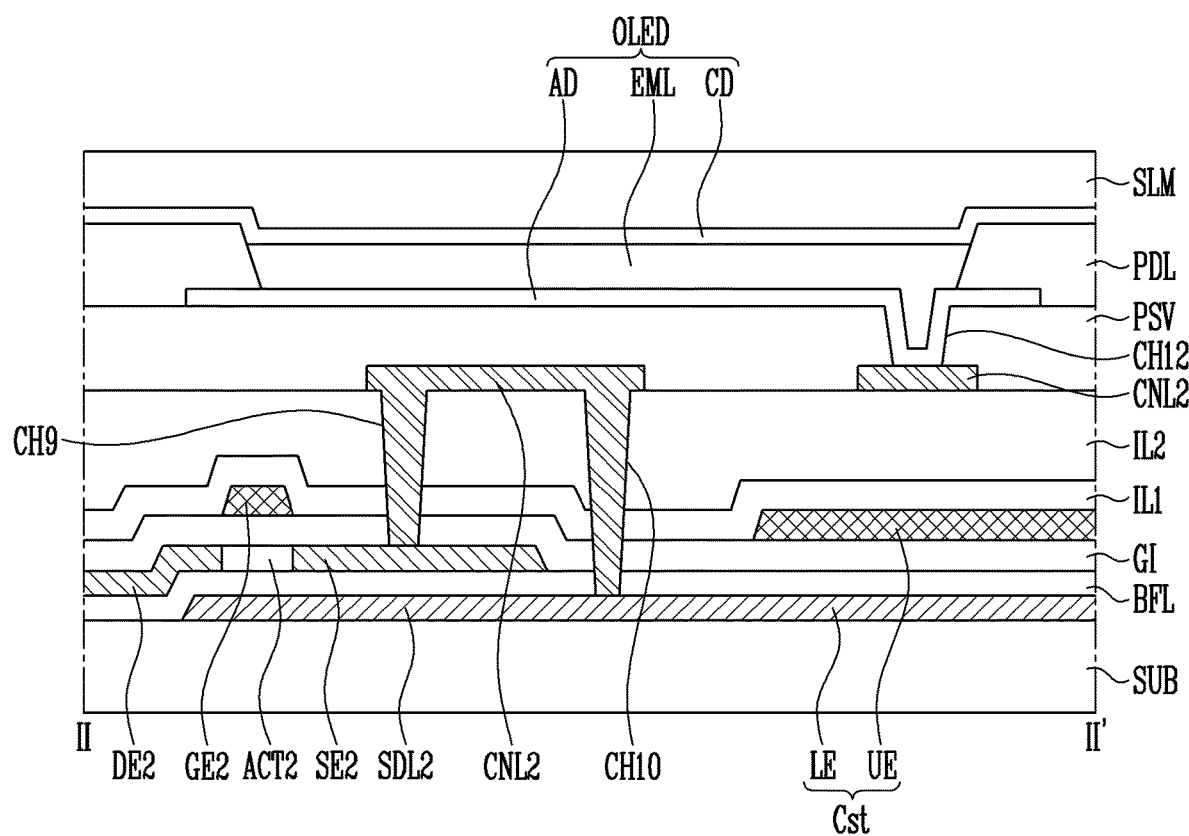

FIG. 10B
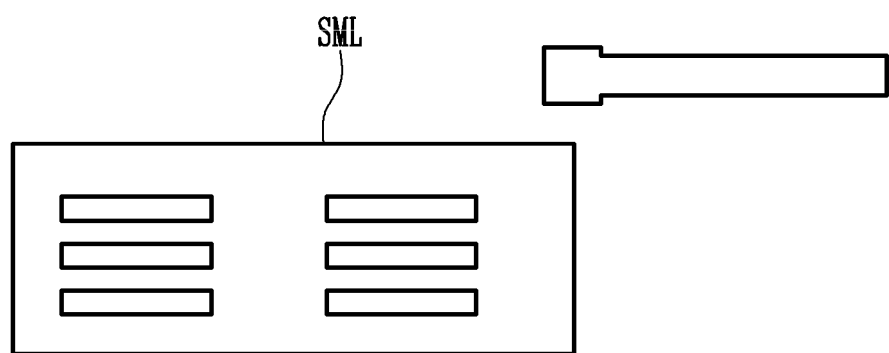
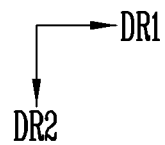

DISPLAY DEVICE

RELATED APPLICATIONS

This application is a continuation application of U.S. patent application Ser. No. 15/816,224 filed on Nov. 17, 2017, which claims priority under 35 USC § 119 to Korean Patent Application No. 10-2016-0155155, filed on Nov. 21, 2016, in the Korean Intellectual Property Office, the disclosures of which are incorporated herein in their entirety by reference.

BACKGROUND

1. Field

An aspect of the present disclosure relates to a display device.

2. Description of the Related Art

As interest in information displays and demand for portable information media increase, research and commercialization has focused on display devices.

Particularly, recently, as the requirement for high resolution display device increases, the size of a pixel has decreased. On the other hand, the structure of a circuit included in the pixel has been gradually complicated.

SUMMARY

Embodiments provide a display device which facilitates the implementation of high resolution.

According to an aspect of the present disclosure, there is provided a display device including: a substrate including a pixel region and a peripheral region; a plurality of pixels provided in the pixel region of the substrate; a scan line and a data line, connected to each of the plurality of pixels; a transistor provided in the pixel region, the transistor including a first transistor connected to the scan line and the data line and a second transistor connected to the first transistor; a light emitting element connected to the transistor; a first blocking layer disposed between the substrate and the first transistor, the first blocking layer being electrically connected to the first transistor; and a second blocking layer disposed between the substrate and the second transistor, the second blocking layer being electrically connected to the second transistor, wherein the first blocking layer is connected to a gate electrode of the first transistor, and the second blocking layer is connected to any one of source and drain electrodes of the second transistor.

When viewed on a plane, the first blocking layer may overlap with a portion of the first transistor, and the second blocking layer may overlap with a portion of the second transistor.

The first blocking layer and the second blocking layer may be provided on the same layer.

The second transistor may include: an active pattern disposed on the substrate; a gate electrode disposed on the active pattern; and source and drain electrodes, each connected to the active pattern. The source electrode may be connected to the second blocking layer.

The second blocking layer may be a light blocking layer that blocks light incident through one surface of the substrate, on which the active pattern of the second transistor is not provided.

The display device may include: a buffer layer disposed between the second blocking layer and the active pattern; and a gate insulating layer, a first insulating layer, and a second insulating layer, sequentially disposed on the buffer layer.

The display device may include: a lower electrode disposed on the gate insulating layer; and an upper electrode disposed on the first insulating layer. The lower electrode and the upper electrode may constitute a storage capacitor with the first insulating layer interposed therebetween.

The lower electrode may be integrally provided with the gate electrode of the second transistor.

The display device may include: a lower electrode disposed between the substrate and the buffer layer; and an upper electrode disposed on the gate insulating layer. The lower electrode and the upper electrode may constitute a storage capacitor with the buffer layer and the gate insulating layer interposed therebetween.

The second blocking layer may be integrally provided with the lower electrode.

The first transistor may include: an active pattern disposed on the substrate; a gate electrode disposed on the active pattern; and source and drain electrodes, each connected to the active pattern. The first blocking layer may be a light blocking layer that blocks light incident through one surface of the substrate, on which the active pattern of the first transistor is not provided.

The display device may further include: an emission control line disposed on the second insulating layer; a third transistor connected to the emission control line and the second transistor; and a third blocking layer connected to the third transistor.

When viewed on a plane, the third blocking layer may overlap with a portion of the third transistor.

The third transistor may include: an active pattern disposed on the substrate; a gate electrode disposed on the active pattern; and source and drain electrodes, each connected to the active pattern. The gate electrode may be connected to the third blocking layer.

The third blocking layer may be a light blocking layer that blocks light incident through one surface of the substrate, on which the active pattern of the third transistor is not provided.

The third blocking layer may be provided on the same layer as the first and second blocking layers.

The emission control line may be provided on the same layer as the data line.

According to another aspect of the present disclosure, there is provided a display device including: a first transistor connected to a data line and a scan line to supply a data signal to a first node; a storage capacitor having one electrode connected to the first node and the other electrode connected to a second node; a light emitting element having one electrode connected to the second node and the other electrode connected to a second power source; a second transistor supplying a current corresponding to a voltage applied to the first node from a first power source to the second power source via the light emitting element; a third transistor connected to the second transistor and an emission control line; and first to third blocking layers respectively provided under active patterns of the first to third transistors, the first to third blocking layers each being connected to a corresponding transistor, wherein at least one of the first to third blocking layers is connected to a source electrode of the second transistor, and the other of the first to third blocking layers is connected to a gate electrode of a corresponding transistor.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 7A, 7B, 7C, 7D and 7E are layout diagrams schematically illustrating components of the pixel shown in FIG. 5 for each layer.

FIG. 9 is a sectional view taken along line II-IT of FIG. 8.

FIGS. 10A, 10B, 10C and 10D are layout diagrams schematically illustrating components of the pixel shown in FIG. 8 for each layer.

DETAILED DESCRIPTION

Figure 1:
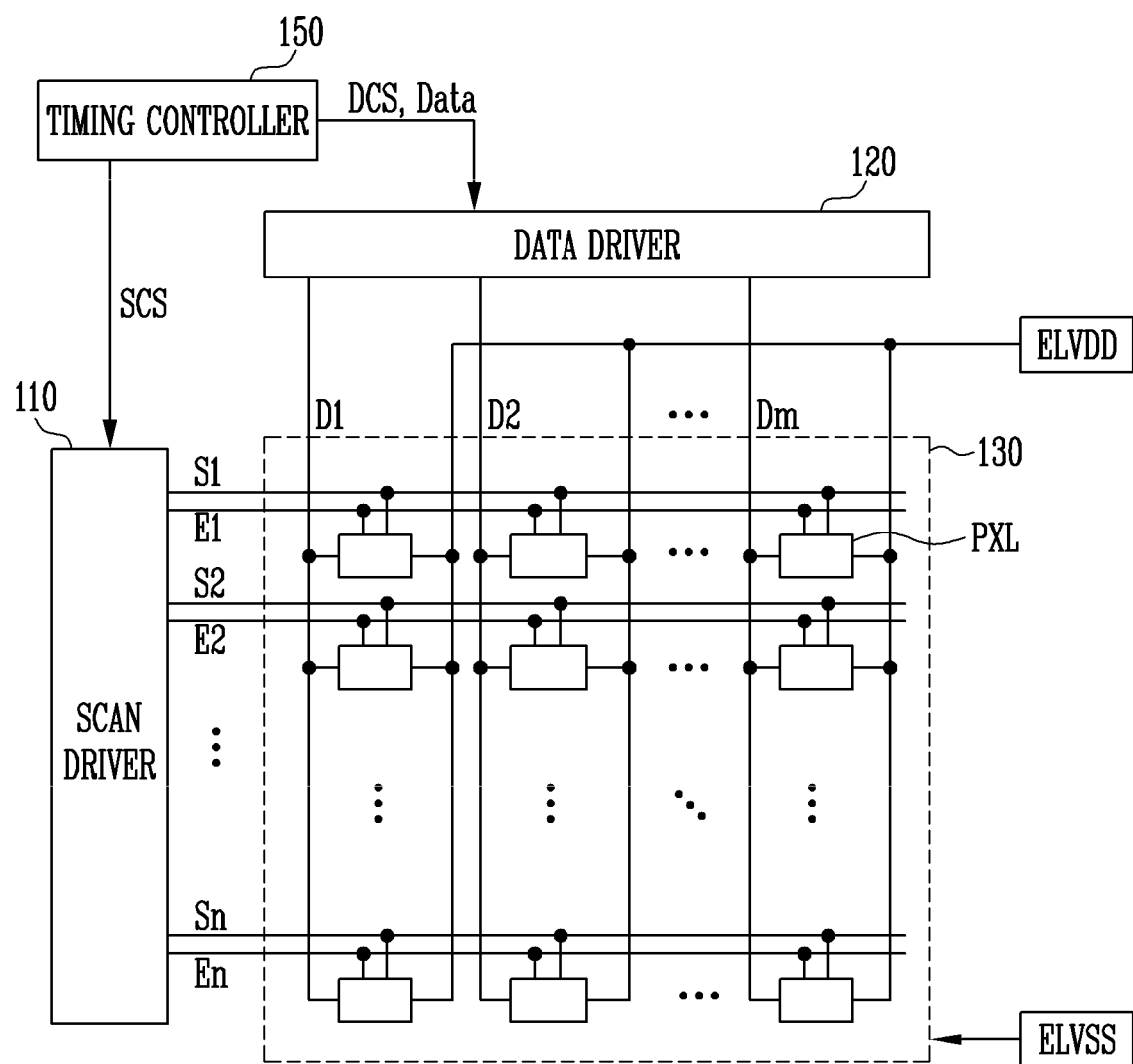
FIG. 1 is a view illustrating a display device according to an embodiment of the present disclosure.

The present disclosure may apply various changes and different shape, therefore only illustrate in details with particular examples. However, the examples do not limit to certain shapes but apply to all the change and equivalent material and replacement. The drawings included are illustrated a fashion where the figures are expanded for the better understanding.

Like numbers refer to like elements throughout. In the drawings, the thickness of certain lines, layers, components, elements or features may be exaggerated for clarity. It will be understood that, although the terms "first", "second", etc. may be used herein to describe various elements, these elements should not be limited by these terms. These terms are only used to distinguish one element from another element. Thus, a "first" element discussed below could also be termed a "second" element without departing from the teachings of the present disclosure. As used herein, the singular forms are intended to include the plural forms as well, unless the context clearly indicates otherwise.

It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. On the contrary, an expression that an element such as a layer, region, substrate or plate is placed "beneath" or "below" another element indicates not only a case where the element is placed "directly beneath" or "just below" the other element but also a case where a further element is interposed between the element and the other element.

Hereinafter, exemplary embodiments of the present disclosure will be described in detail with reference to the accompanying drawings.

FIG. 1 is a view illustrating a display device according to an embodiment of the present disclosure.

Referring to FIG. 1, the display device according to the embodiment of the present disclosure may include a scan driver 110, a data driver 120, a pixel unit 130 including pixels PXL, and a timing controller 150.

The pixel unit 130 includes pixels PXL disposed in regions defined by scan lines S1 to Sn and data lines D1 to Dm. In FIG. 1, it is illustrated that the pixel unit 130 includes m×n pixels PXL. The pixels PXL are supplied with a first power source ELVDD and a second power source ELVSS from the outside. In an embodiment of the present disclosure, the second power source ELVSS may be set to a voltage lower than that of the first power source ELVDD. The pixels PXL are supplied with a data signal, corresponding to a scan signal supplied to the scan lines S1 to Sn. Each of the pixels PXL supplied with the data signal generates light with a predetermined luminance while controlling the amount of current flowing from the first power source ELVDD to the second power source ELVSS via a light emitting device, corresponding to the data signal.

Each of the pixels PXL in the pixel unit 130 shown in FIG. 1 may be a sub-pixel included in a unit pixel. That is, each of the pixels PXL may be a sub-pixel that generates light of any one color among red, green, and blue, but the present disclosure is not limited thereto.

The timing controller 150 generates a data driving control signal DCS and a scan driving control signal SCS, corresponding to synchronization signals supplied from the outside, for example, a graphic controller. The data driving control signal DCS generated from the timing controller 150 is supplied to the data driver 120, and the scan driving control signal SCS generated from the timing controller 150 is supplied to the scan driver 110. Also, the timing controller 150 rearranges data supplied from the outside and supplies the rearranged data Data to the data driver 120.

The scan driver 110 is supplied with the scan driving control signal SCS from the timing controller 150. The scan driver 110 supplied with the scan driving control signal SCS supplies the scan signal to the scan lines S1 to Sn. If the scan signal is supplied to the scan lines S1 to Sn, the pixels PXL connected to the scan line are selected.

In addition, the scan driver 110 supplied with the scan driving control signal SCS may include an emission control driver (not shown) that supplies an operation control signal to emission control lines E1 to En. The operation control signal may be used to control an emission time of each pixel PXL and compensate for an initialization voltage and a threshold voltage of the pixel PXL.

The data driver 120 supplies the data signal to the data lines D1 to Dm, corresponding to the data driving control signal DCS. The data signal supplied to the data lines D1 to Dm is supplied to the selected pixels PXL by the scan signal. To this end, the data driver 120 may supply the data signal to the data lines D1 to Dm to be synchronized with the scan signal. The data driver 120 may include a compensator that extracts current information of the light emitting device from each pixel PXL. The compensator may extract a current value of the light emitting device included in each of the pixels PXL during a sensing period in which the operation control signal is supplied to the emission control lines E1 to En.

In an embodiment, the display device may be driven in a simultaneous emission manner.

According to the simultaneous emission manner, the period of one frame includes an addressing period in which a plurality of data signals are transmitted and programmed to each of the pixels PXL, and an emission period in which light is emitted according to each of the data signals programmed in the respective pixels PXL after the data signals are completely programmed to the pixels PXL. In an embodiment, the data signals are sequentially input, but light may be emitted from the light emitting devices at the same time after the data signals are completely input.

More specifically, in an embodiment, each pixel PXL may be driven, generally including a first period (an initializing step of initializing a driving voltage of the light emitting device in the pixel PXL), a second period (a threshold voltage compensating step of compensating a threshold voltage of a driving transistor of the light emitting device), a third period (an addressing step of addressing the data signal to each of a plurality of pixels PXL), and a fourth period (a light emitting step of allowing the light emitting device of each of a plurality of pixels PXL to emit light, corresponding to the data signal).

The third period is sequentially performed for each of the scan lines S1 to Sn, but the other periods may be simultaneously performed in the pixel unit 130. The first to fourth periods will be described in detail later with reference to FIGS. 2 and 3.

Figure 2:
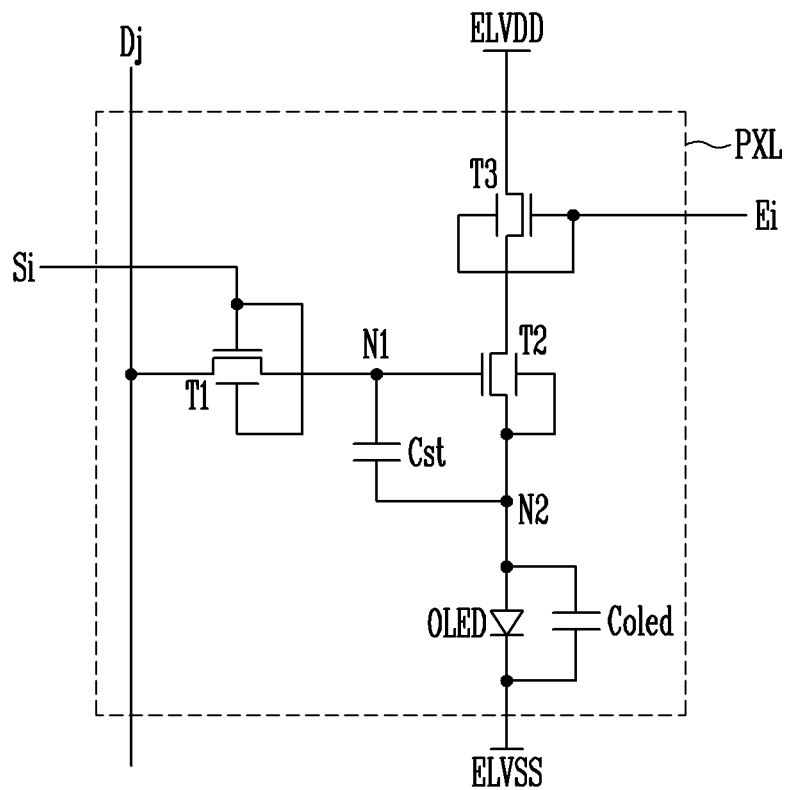
FIG. 2 is a circuit diagram illustrating an embodiment of a pixel shown in FIG. 1.
Figure 3:
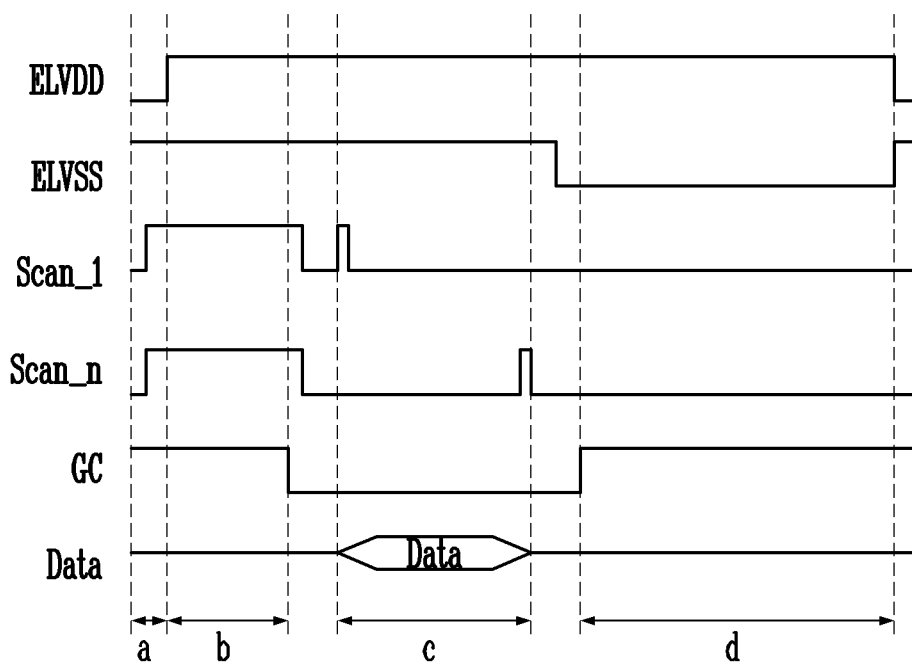
FIG. 3 is a driving timing diagram illustrating driving of the pixel shown in FIG. 2.

FIG. 2 is a circuit diagram illustrating an embodiment of the pixel shown in FIG. 1. FIG. 3 is a driving timing diagram illustrating driving of the pixel shown in FIG. 2. A pixel PXL located on an ith row (i is a natural number smaller than n) and a jth column (j is a natural number smaller than m) is illustrated in FIG. 2.

Referring to FIGS. 1 to 3, the pixel PXL according to the embodiment of the present disclosure may include a light emitting element OLED, a data line Dj, a scan line Si, and an emission control line Ei. Also, the pixel PXL may include a pixel circuit connected to each of the data line Dj, the scan line Si, and the emission control line Ei.

An anode electrode of the light emitting element OLED is connected to the pixel circuit, and a cathode electrode of the light emitting element OLED is connected to the second power source ELVSS. The light emitting element OLED generates light with a predetermined luminance corresponding to the amount of current supplied from the pixel circuit unit. To this end, the second power source ELVSS may be set to a voltage lower than that of the first power source ELVDD during a driving period of the display device.

The pixel circuit may control the amount of current flowing from the first power source ELVDD to the second power source ELVSS via the light emitting element OLED, corresponding to a data signal Data. To this end, the pixel circuit may include first to third transistors T1 to T3, a storage capacitor Cst, and an auxiliary capacitor Coled.

The first transistor (switching transistor) T1 is disposed between the data line Dj and a first node N1, and is connected to each of the data line Dj and a gate electrode of the second transistor T2. The first transistor T1 is turned on when a scan signal Scan_1 to Scan_n is supplied to the scan line Si, to allow the data line Dj and the gate electrode of the second transistor T2 to be electrically connected to each other. The first transistor T1 may be turned on in response to the scan signal Scan_1 to Scan_n provided through the scan line Si to perform a switching operation of transmitting the data signal Data provided from the data line Dj to the gate electrode of the second transistor T2. To this end, the first transistor T1 may include a gate electrode connected to the scan line Si, a drain electrode connected to the data line Dj, and a source electrode connected to a first node N1. The gate electrode of the first transistor T1 may be connected to a first blocking layer made of a conductive material. Here, the first blocking layer may be disposed under the first transistor T1 to partially overlap with the first transistor T1. The first blocking layer may be disposed under the first transistor T1 to completely overlap with a channel region of the first transistor T1.

The second transistor (driving transistor) T2 may be disposed between the power source ELVDD and the second power source ELVSS. The gate electrode of the second transistor T2 may be connected to the first node N1, a source electrode of the second transistor T2 may be connected to the anode electrode of the light emitting element OLED, and a drain electrode of the second transistor T2 may be connected to the first power source ELVDD via the third transistor. The second transistor T2 controls the amount of the current flowing from the first power source ELVDD to the second power source ELVSS via the light emitting element OLED, corresponding to a voltage of the first node N1. The source electrode of the second transistor T2 may be connected to a second blocking layer made of a conductive material. Here, the second blocking layer may be disposed under the second transistor T2 to partially overlap with the second transistor T2. The second blocking layer may be disposed under the second transistor T2 to completely overlap with a channel region of the second transistor T2.

The third transistor T3 is disposed between the first power source ELVDD and the second transistor T2, and is connected to each of the first power source ELVDD and the second transistor T2. In addition, a gate electrode of the third transistor T3 is connected to the emission control line Ei. Turn-on/turn-off of the third transistor T3 may be determined by an operation control signal GC applied to the emission control line Ei. The third transistor T3 may include the gate electrode connected to the emission control line Ei, a drain electrode connected to the first power source ELVDD, and a source electrode connected to the drain electrode of the second transistor T2. The gate electrode of the third transistor T3 may be connected to a third blocking layer made of a conductive material. Here, the third blocking layer may be disposed under the third transistor T3 to partially overlap with the third transistor T3. The third blocking layer may be disposed under the third transistor T3 to completely overlap with a channel region of the third transistor T3.

In FIG. 2, it is illustrated that the first to third transistors T1 to T3 are all implemented as NMOS transistors, but the present disclosure is not limited thereto. For example, the first to third transistors T1 to T3 may be implemented as PMOS transistors.

The storage capacitor Cst stores a voltage corresponding to the data signal Data, and is connected between the first node N1 and a second node N2.

The auxiliary capacitor Coled may be connected to use the coupling effect of the storage capacitor by considering the capacity of a parasitic capacitor, generated by the anode and cathode electrodes of the light emitting element OLED.

Each pixel PXL may be driven in the simultaneous emission manner. In this case, one frame may be implemented, including a first period (an initialization period, hereinafter referred to as "a"), a second period (a threshold voltage compensation period, hereinafter referred to as "b"), a third period (an addressing period, hereinafter referred to as "c"), and a fourth period (a light emitting period, hereinafter referred to as "d").

The first period a is a step of initializing a voltage applied to the light emitting element OLED. The first period a may be a period in which, when the cathode electrode of the light emitting element OLED is fixed to a certain voltage, a voltage applied to the anode electrode of the light emitting element OLED is set to a predetermined voltage, for example, 0V. In an embodiment, the voltage applied to the cathode electrode of the light emitting element OLED may be set to a voltage higher than 0V so as to block leakage current generated during the first period a.

During the first period a, the first power source ELVDD may be applied at a low level (e.g., 0V), the scan signal Scan_1 to Scan_n may be applied at a high level to a corresponding scan line, the operation control signal GC may be applied at a high level, and the data signal Data may be applied at a low level. In this case, the data signal Data may be applied at a predetermined high level so as to rapidly initialize the voltage applied to the anode electrode of the light emitting element OLED. In addition, during the first period a, the second power source ELVSS may be applied at a predetermined high level.

During the first period a, electric charges accumulated in the anode electrode of the light emitting element OLED is quickly discharged by the voltage of 0V, and the voltage of the light emitting element OLED may also be quickly initialized.

The second period b is a step of compensating for a threshold voltage of the second transistor T2. During the second period b, the threshold voltage of the second transistor T2 is stored in the storage capacitor Cst. After that, the threshold voltage of the second transistor T2 can remove a failure caused by a threshold voltage variation of the second transistor T2 when the data signal Data is charged in each pixel PXL.

During the second period b, the first power source ELVDD may be applied at a high level, each of the scan signal Scan_1 to Scan_n and the operation control signal GC may be applied at a high level, and the data signal Data may be applied at the same level as the first period a. In this case, the data signal Data may be applied at a predetermined high level at which the second transistor T2 can be turned on.

Each of the signals applied to each pixel PXL during the second period b, i.e., the first power source ELVDD, the scan signal Scan, the operation control signal GC, the data signal Data, and the second power source ELVSS may be simultaneously applied with a voltage value of a set level to a plurality of pixels PXL. As the signal is applied as described above, during the second period b, the first to third transistors T1 to T3 may be turned on, and a voltage corresponding to the threshold voltage of the second transistor T2 may be charged in the storage capacitor Cst.

The third period c is a step of sequentially applying the scan signal Scan_1 to Scan_n to the scan lines S1 to Sn connected to the pixels PXL and applying the data signal Data to a data line (D1 to Dm of FIG. 1) of each pixel, corresponding to the scan signal Scan_1 to Scan_n. In this case, the second power source ELVSS may be applied at the same level as the first period a and the second period b.

During the third period c, the operation control signal GC may be applied at a low level. As the operation control signal GC is applied at the low level, the third transistor T3 is turned off, and accordingly, the first power source ELVDD may be provided as a voltage of any level during the third period c. In an embodiment, the first power source ELVDD may be applied at a high level during the third period c.

In the pixel PXL according to the embodiment of the present disclosure, the scan signal Scan_1 to Scan_n of a high level is applied during the third period c, so that the first transistor T1 is turned on. Accordingly, the data signal Data having a predetermined level value is applied to the first node N1 via the drain and source electrodes of the first transistor T1. In this case, voltages at both ends of the storage capacitor Cst may be changed depending on a change in voltage of the data signal Data. Also, in the pixel PXL according to the embodiment of the present disclosure, the third transistor T3 is turned off during the third period c, so that any current path is not formed between the light emitting element OLED and the first power source ELVDD. Therefore, the light emitting element OLED does not emit light during the third period c.

The fourth period d is a light emitting period in which the light emitting element OLED emits light corresponding to the data signal Data input during the third period c.

During the fourth period d, the first power source ELVDD may be applied at a high level, the scan signal Scan_1 to Scan_n may be applied at a low level, and the operation control signal GC may be applied at a high level. In this case, the data signal Data may be applied at a predetermined level at which any leakage current is not generated in the first transistor T1.

Each of the signals applied to each pixel PXL during the fourth period d, i.e., the first power source ELVDD, the scan signal Scan, the operation control signal GC, and the data signal Data may be simultaneously applied as a voltage value of a set level. As the signal is applied as described above, during the fourth period d, the first transistor T1 may be turned off, and the second and third transistors T2 and T3 may be turned on. As the second and third transistors T2 and T3 are turned on, a current path is formed between the first power source ELVDD and the light emitting element OLED, so that a current corresponding to the voltage between the gate and source electrodes of the second transistor T2 is applied to the light emitting element OLED. Therefore, the light emitting element OLED emits light.

Figure 4:
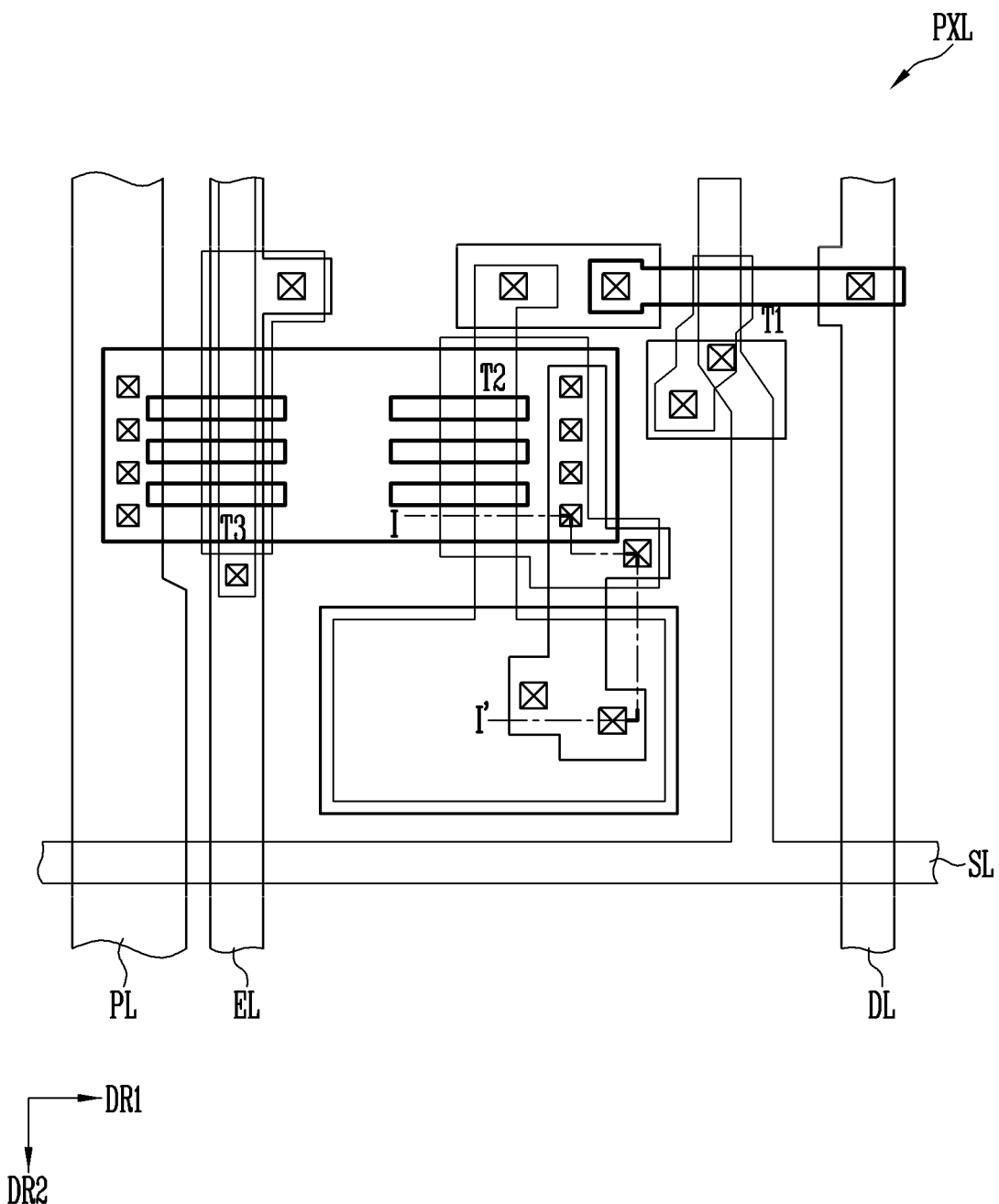
FIG. 4 is a plan view implementing the pixel of FIG. 2 according to an embodiment of the inventive concept.
Figure 5:
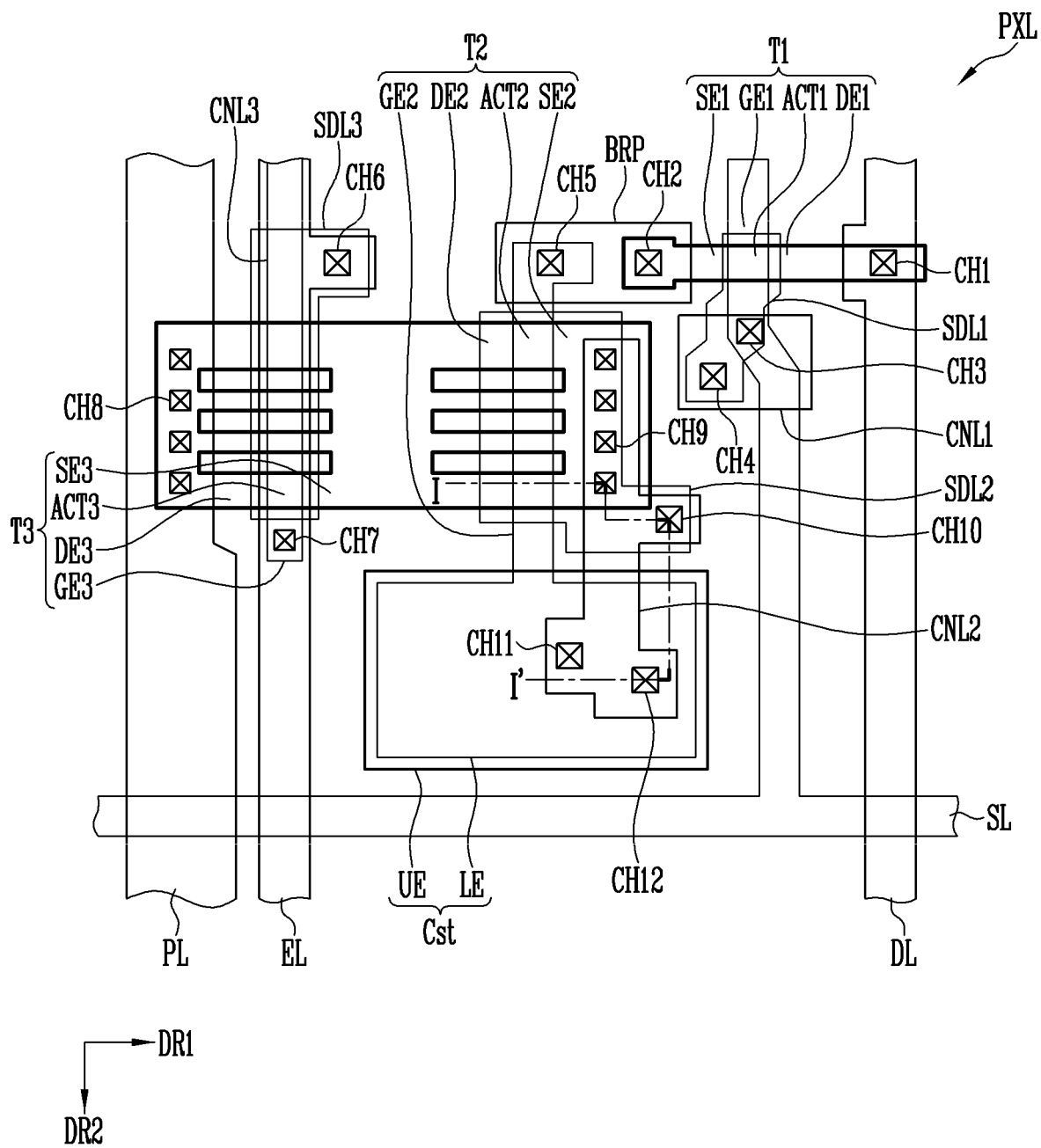
FIG. 5 is a plan view illustrating in detail the pixel of FIG. 4.
Figure 6:
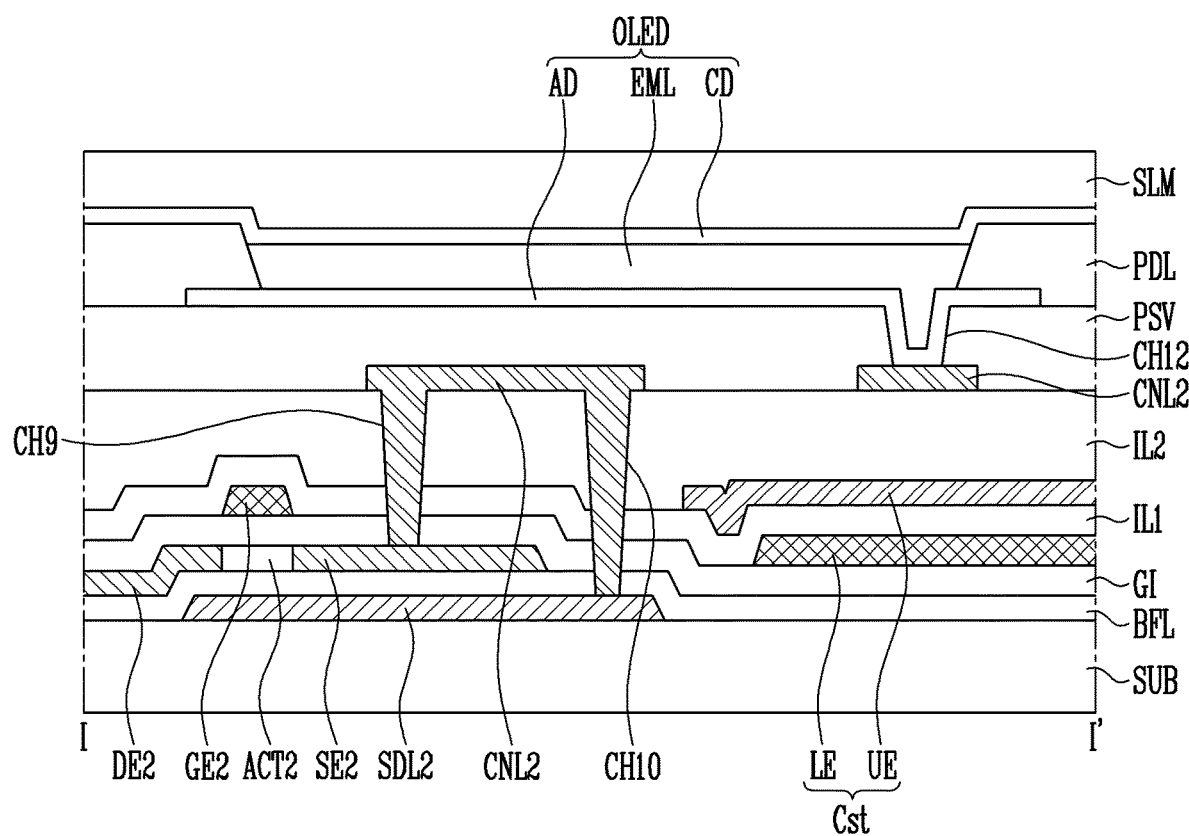
FIG. 6 is a sectional view taken along line I-I' of FIG. 5.
Figure 7C:
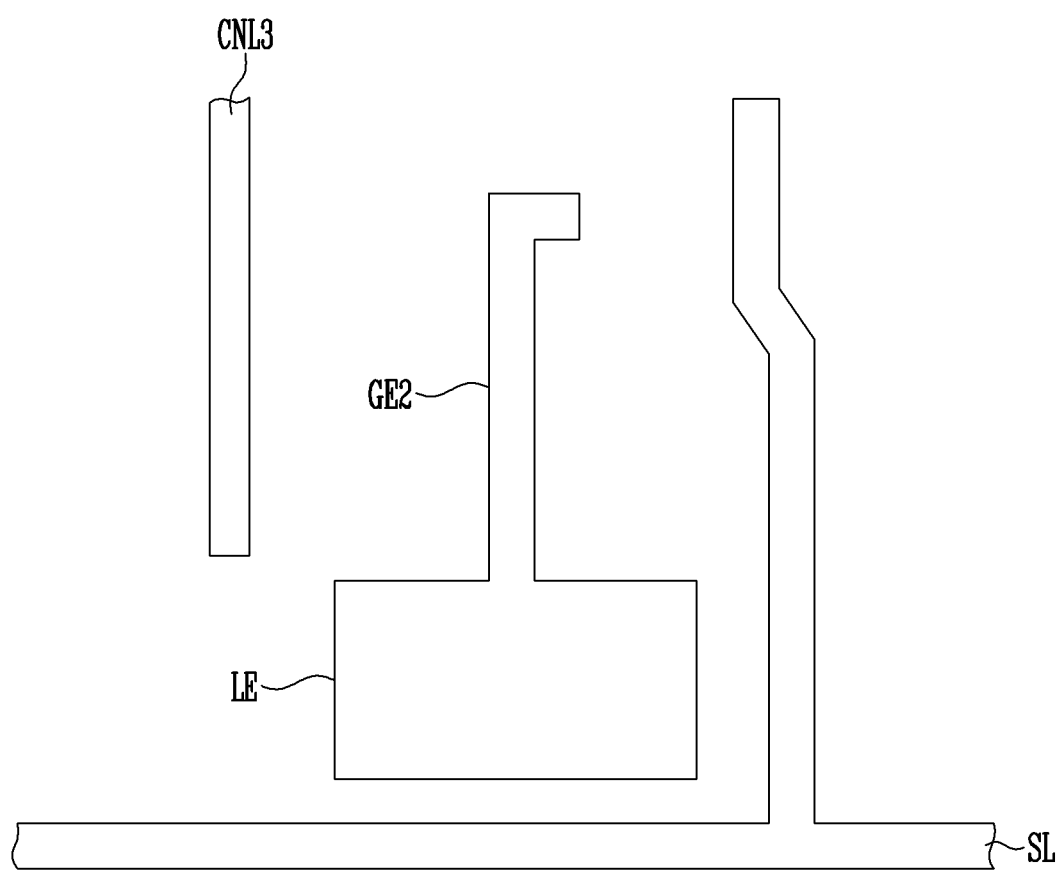
Figure 7D:
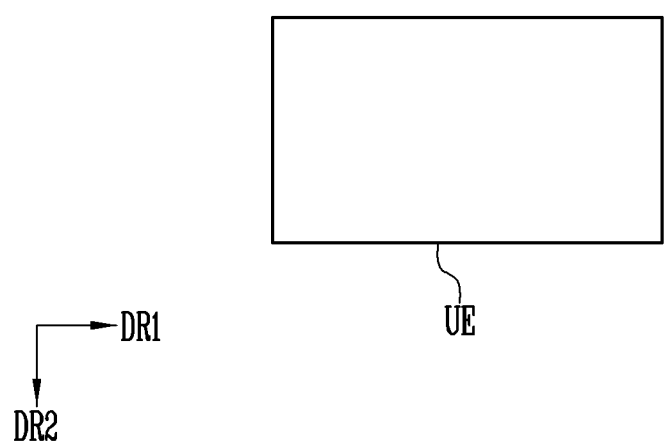
Figure 7E:
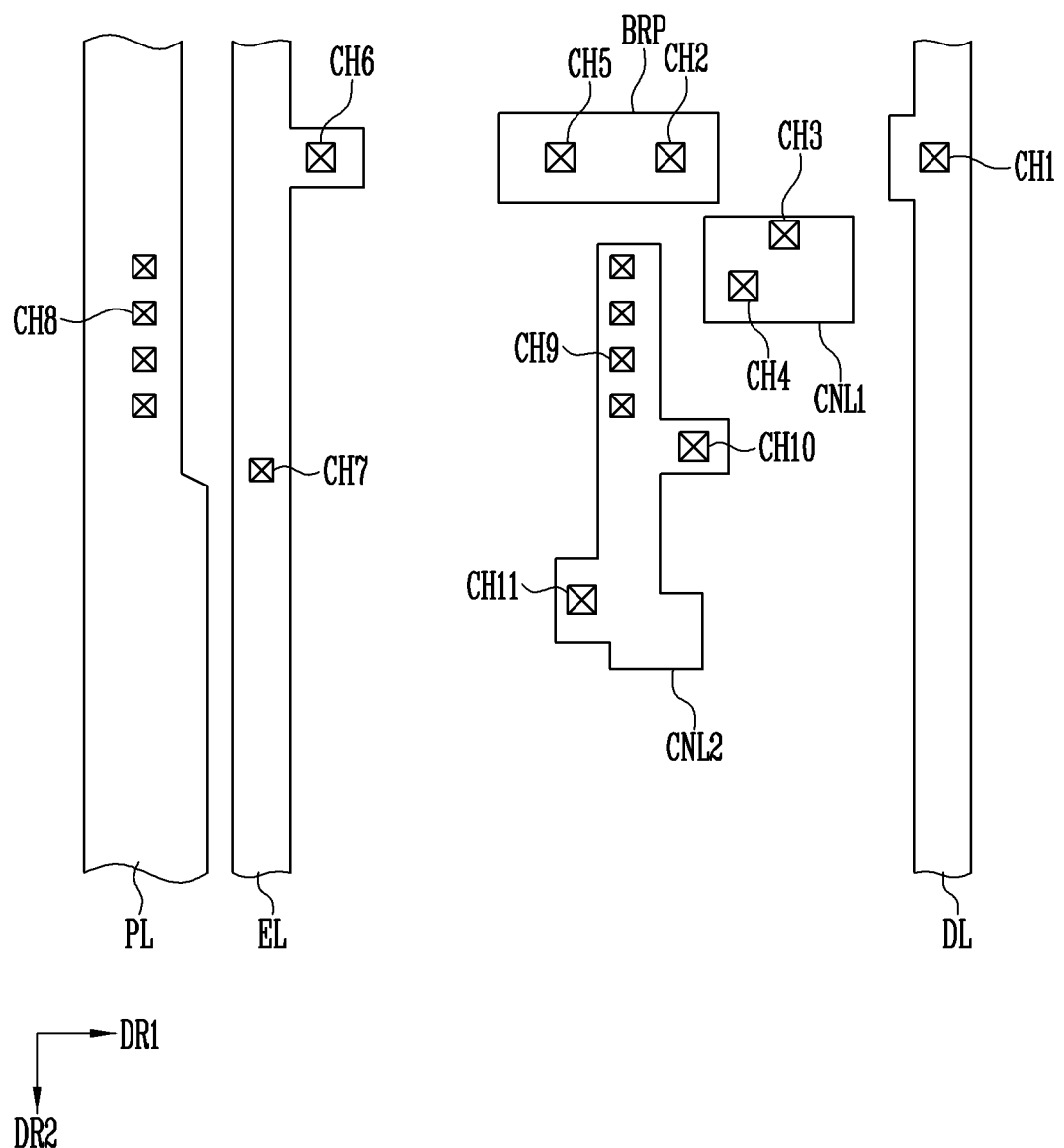

FIG. 4 is a plan view implementing the pixel of FIG. 2 according to an embodiment of the inventive concept. FIG. 5 is a plan view illustrating in detail the pixel of FIG. 4. FIG. 6 is a sectional view taken along line I-I' of FIG. 5. In FIGS. 4 to 6, for convenience of description, in lines provided to one pixel, a scan line to which a scan signal is applied is designated as a "scan line SL," an emission control line to which an operation control signal is applied is designated as an "emission control line EL," a data line to which a data signal is applied is designated as a "data line DL1," and a power line to which the first power source ELVDD is applied is designated as a "power line PL."

Referring to FIGS. 2 to 6, the display device according to the embodiment of the present disclosure includes a substrate SUB, signal lines and pixels PXL.

The substrate SUB may include a pixel region and a peripheral region provided at at least one side of the pixel region. The pixel region is a region in which the pixels PXL are provided to display an image, and the peripheral region is a region in which the pixels PXL are not provided. The peripheral region may be a region in which any image is not displayed.

The substrate SUB may include an insulative material such as glass, organic polymer, or quartz. The substrate SUB may be made of a material having flexibility to be bendable or foldable. The substrate SUB may have a single-layered or multi-layered structure.

For example, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material constituting the substrate SUB may be variously changed.

The signal lines provide signals to each pixel PXL, and includes a scan line SL, a data line DL1, an emission control line EL, and a power line PL.

The scan line SL may include a first portion extending in a first direction DR1 and a second portion protruding from the first portion to extend in a second direction DR2 intersecting the first direction DR1. A scan signal may be provided to the scan line SL.

The emission control line EL extends in the second direction DR2 and may be disposed to be spaced apart from the data line DL. An operation control signal may be provided to the emission control line EL.

The data line DL extends in the second direction DR2, and the emission control line EL and the data line DL are sequentially arranged along the first direction DR1.

The power line PL extends along the second direction DR2 and may be disposed to be spaced apart from the data line DL. The first power source ELVDD may be provided to the power line PL.

Each pixel PXL may include first to third blocking layers SDL1 to SDL3, first to third transistors T1 to T3, a storage capacitor Cst, a light emitting element OLED, and a bridge pattern BRP.

The first to third blocking layers SDL1 to SDL3 may be disposed on the substrate SUB. The first to third blocking layers SDL1 to SDL3 may be made of a conductive material, e.g., metal. The first to third blocking layers SDL1 to SDL3 may be formed of a single metal, but be made of two kinds of metals, an alloy of two kinds of metals, or the like. In addition, the first to third blocking layers SDL1 to SDL3 may be formed in a single layer or a multi-layer. The first to third blocking layers SDL1 to SDL3 may block light incident through the back surface of the substrate SUB. Here, the first blocking layer SDL1 may partially overlap with the first transistor T1 when viewed on a plane. The second blocking layer SDL2 may partially overlap with the second transistor T2 when viewed on a plane. In addition, the third blocking layer SDL3 may partially overlap with the third transistor T3 when viewed on a plane.

The first transistor T1 includes a first gate electrode GE1, a first active pattern ACT1, a first source electrode SE1, and a first drain electrode DEL The first gate electrode GE1 is connected to the scan line SL. The first gate electrode GE1 may be provided as a portion of the scan line SL, but the present disclosure is not limited thereto. For example, the first gate electrode GE1 may be provided in a shape protruding from the scan line SL. In an embodiment, the first active pattern ACT1, the first source electrode SE1, and the first drain electrode DE1 may be formed of a semiconductor layer that is undoped with an impurity or is doped with the impurity. The first source electrode SE1 and the first drain electrode DE1 may be formed of the semiconductor layer that is doped with the impurity, and the first active pattern ACT1 may be formed of the semiconductor layer that is undoped with the impurity. The first active pattern ACT1 corresponds to a portion overlapping with the first gate electrode GE1. One end of the first source electrode SE1 is connected to the first active pattern ACT1, and the other end of the first source electrode SE1 is connected to the bridge pattern BRP through a second contact hole CH2. One end of the first drain electrode DE1 is connected to the first active pattern ACT1, and the other end of the first drain electrode DE1 is connected to the data line DL through the first contact hole CH1.

The first transistor T1 partially overlaps with the first blocking layer SDL1 when viewed on a plane. In particular, the first active pattern ACT1 of the first transistor T1 may completely overlap with the first blocking layer SDL1. Therefore, when light is incident through the back surface of the substrate SUB, the first blocking layer SDL1 can block the light from reaching the first active pattern ACT1 by covering the first active pattern ACT1.

The first blocking layer SDL1 may be connected to the first gate electrode GE1 of the first transistor T1 through a first connection line CNL1 and third and fourth contact holes CH3 and CH4. One side of the first connection line CNL1 is connected to the first gate electrode GE1 through the third contact hole CH3, and the other side of the first connection line CNL1 is connected to the first blocking layer SDL1 through the fourth contact hole CH4. Therefore, the first gate electrode GE1 and the first blocking layer SDL1 may be electrically connected to each other. Thus, a voltage of the same level as a voltage provided to the first gate electrode GE1 may be applied to the first blocking layer SDL1. The first blocking layer SDL1 may be disposed between the substrate SUB and the semiconductor layer.

As described above, if the first blocking layer SDL1 is electrically connected to the first gate electrode GE1, channels may be formed on a top surface and a bottom surface of the first active pattern ACT1, thus, the storage capacitor Cst can be charged to a data voltage quickly because on current Ion of the first transistor T1 may be increased.

If the first blocking layer SDL1 is connected to the first source electrode SE1, a parasitic capacitor may be generated between a second gate electrode GE2 of the second transistor T2 and the first source electrode SE1 by the scan signal provided to the first gate electrode GE1. Therefore, electrical properties of the first transistor T1 may be deteriorated.

Thus, as the first blocking layer SDL1 is electrically connected to the first gate electrode GE1, electrical properties of the first and second transistors T1 and T2 can be improved.

The second transistor T2 includes the second gate electrode GE2, a second active pattern ACT2, a second source electrode SE2, and a second drain electrode DE2.

The second gate electrode GE2 is connected to the first source electrode SE1 of the first transistor T1. The bridge pattern BRP connects between the second gate electrode GE2 and the first source electrode SE1. The bridge pattern BRP connects the second gate electrode GE2 to the first source electrode SE1 through the second contact hole CH2 and a fifth contact hole CH5.

In addition, the second gate electrode GE2 extends along the second direction DR2 when viewed on a plane, and may be integrally provided with a lower electrode LE of the storage capacitor Cst which will be described later. That is, the second gate electrode GE2 may be provided in the same layer as the lower electrode LE.

In an embodiment, the second active pattern ACT2, the second source electrode SE2, and the second drain electrode DE2 may be formed of a semiconductor layer that is undoped with an impurity or is doped with the impurity. The second source electrode SE2 and the second drain electrode DE2 may be formed of the semiconductor layer that is doped with the impurity, and the second active pattern ACT2 may be formed of the semiconductor layer that is undoped with the impurity. The second active pattern ACT2 may partially overlap with a portion of the second gate electrode GE2 when viewed on a plane. One end of the second source electrode SE2 is connected to the second active pattern ACT2, and the other end of the second source electrode SE2 is connected to an anode electrode AD of the light emitting element OLED through a second connection line CNL2 and a twelfth contact hole CH12. One end of the second drain electrode DE2 is connected to the second active pattern ACT2, and the other end of the second drain electrode DE2 is connected to a third source electrode SE3 of the third transistor T3.

The second transistor T2 partially overlaps with the second blocking layer SDL2 when viewed on a plane. In particular, the second active pattern ACT2 of the second transistor T2 may completely overlap with the second blocking layer SDL2. Therefore, when light is incident through the back surface of the substrate SUB, the second blocking layer SDL2 can block the light from reaching the second active pattern ACT2 by covering the second active pattern ACT2.

The second blocking layer SDL2 may be connected to the second source electrode SE2 of the second transistor T through the second connection layer CNL2 and ninth and tenth contact holes CH9 and CH10. One side of the second connection line CNL2 is connected to the second source electrode SE2 through the ninth contact hole CH9, and the other side of the second connection line CNL2 is connected to the second blocking layer SDL2 through the tenth contact hole CH10. Therefore, the second source electrode SE2 and the second blocking layer SDL2 may be electrically connected to each other. Thus, a voltage of the same level as a voltage provided to the second source electrode SE2 can be applied to the second blocking layer SDL2. The second blocking layer SDL2 may be a component that is first disposed on the substrate SUB, like the first blocking layer SDL.

As described above, if the second blocking layer SDL2 is electrically connected to the second source electrode SE2, a swing width margin of the second power source ELVSS can be ensured. In this case, the driving range of a gate voltage applied to the second gate electrode GE2 of the second transistor T2 can be widened.

In the display according to the embodiment of the present disclosure, the second blocking layer SDL2 may be electrically connected to the second source electrode SE2, but the present disclosure is not limited thereto. For example, the second blocking layer SDL2 may also be electrically connected to the second gate electrode GE2.

If the second blocking layer SDL2 is electrically connected to the second gate electrode GE2, an on-current Ion of the second transistor T2 may be increased. In this case, the capacitance of the storage capacitor Cst may be increased and be stable in coupling. The second transistor T2, as shown in the drawings, may be provided in plural numbers so as to prevent leakage current, but the present disclosure is not limited thereto. For example, one second transistor T2 may be provided, like the first transistor T1.

The third transistor T3 includes a third gate electrode GE3, an active pattern ACT3, the third source electrode SE3, and a third drain electrode DE3.

In an embodiment, the third active pattern ACT3, the third source electrode SE3, and the third drain electrode DE3 may be formed of a semiconductor layer that is undoped with an impurity or is doped with the impurity. The third source electrode SE3 and the third drain electrode DE3 may be formed of the semiconductor layer that is doped with the impurity, and the third active pattern ACT3 may be formed of the semiconductor layer that is undoped with the impurity. The third active pattern ACT3 corresponds to a portion overlapping with the third gate electrode GE3. One end of the third source electrode SE3 is connected to the third active pattern ACT3, and the other end of the third source electrode SE3 is connected to the second drain electrode DE2 of the second transistor T2. One end of the third drain electrode DE3 is connected to the third active pattern ACT3, and the other end of the third drain electrode DE3 is connected to the power line PL through an eighth contact hole CH8.

The third transistor T3 partially overlaps with the third blocking layer SDL3 when viewed on a plane. In particular, the third active pattern ACT3 of the third transistor T3 may completely overlap with the third blocking layer SDL3. Therefore, when light is incident through the back surface of the substrate SUB, the third blocking layer SDL3 can block the light from reaching the third active pattern ACT3 by covering the third active pattern ACT3.

The third blocking layer SDL3 may be connected to the third gate electrode GE3 of the third transistor T3 through a third connection line CNL3, a sixth contact hole CH6, and a seventh contact hole CH7. One side of the third connection line CNL3 may be connected to the third blocking layer SDL3 through the sixth contact hole CH6, and the other side of the third connection line CNL3 may be connected to the third gate electrode GE3. Therefore, the third blocking layer SDL3 and the third gate electrode GE3 may be electrically connected to each other. Thus, a voltage of the same level as a voltage provided to the third gate electrode GE3 may be applied to the third blocking layer SDL3. Like the first and second blocking layers SDL1 and SDL2, the third blocking layer SDL3 may be a component that is first disposed on the substrate SUB.

As described above, if the third blocking layer SDL3 is electrically connected to the third gate electrode GE3, the on-current Ion is increased, so that electrical properties of the third transistor T3 can be improved.

If the third blocking layer SDL3 is connected to the third source electrode SE3, an initialization time may be taken longer than that when the third blocking layer SDL3 is connected to the third gate electrode GE3.

Thus, as the third blocking layer SDL3 is electrically connected to the third gate electrode GE3, electrical properties of the third transistor T3 can be improved.

The third transistor T3, as shown in the drawings, may be provided in plurality so as to prevent leakage current, but the present disclosure is not limited thereto. For example, one third transistor T3 may be provided, like the first transistor T1.

The storage capacitor Cst includes the lower electrode LE and an upper electrode UE. The lower electrode LE of the storage capacitor Cst may be provided as the second gate electrode GE2 of the second transistor T2. The upper electrode UE of the storage capacitor Cst overlaps with the second gate electrode GE2 with a first insulating layer IL1 interposed therebetween, and covers a majority of the second gate electrode GE2 when viewed on a plane. The overlapping area of the upper electrode UE and the lower electrode LE is widened, so that the capacitance of the storage capacitor Cst can be increased.

The light emitting element OLED may include the anode electrode AD, a cathode electrode CD, and an emitting layer EML provided between the anode electrode AD and the cathode electrode CD.

The anode electrode AD is provided in a pixel region corresponding to each pixel PXL. The anode electrode AD is connected to the upper electrode UE of the storage capacitor Cst and the second source electrode SE2 of the second transistor T2 through an eleventh contact hole CH11 and the twelfth contact hole CH12. The second connection line CNL2 may be provided between the eleventh contact hole CH11 and the twelfth contact hole CH12. The second connection line CNL2 may be a component that allows the upper electrode UE, the second source electrode SE2, and the anode electrode AD to be connected to each other.

Again, a structure of the display device according to the embodiment of the present disclosure will be described along a stacking order with reference to FIGS. 2 to 6.

First, the first to third blocking layers SDL1 to SDL3 may be disposed on the substrate SUB. The first to third blocking layers SDL1 to SDL3 may be spaced apart from each other on the substrate SUB. The first to third blocking layers SDL1 to SDL3 may be made of a conductive material, e.g., metal. The first to third blocking layers SDL1 to SDL3 may be formed of a single metal, but be made of two kinds of metals, an alloy of two kinds of metals, or the like. In addition, the first to third blocking layers SDL1 to SDL3 may be formed in a single layer or a multi-layer. The first to third blocking layers SDL1 to SDL3 may block light incident through the back surface of the substrate SUB from reaching the first to third active layers ACT1 to ACT3. The first to third blocking layers SDL1 to SDL3 may be provided in various shapes within a limit capable of blocking the light from being incident into the first to third transistors T1 to T3 from the back surface of the substrate SUB. In an embodiment, the first to third blocking layers SDL1 to SDL3 may be provided in a quadrangular shape and a polygonal shape when viewed on a plane. However, the present disclosure is not limited thereto, and the first to third blocking layers SDL1 to SDL3 may be provided in various shapes including an elliptical shape, a circular shape, and the like.

Subsequently, a buffer layer BFL may be provided over the first to third blocking layers SDL1 to SDL3. The buffer layer BFL may be made of an organic insulating material or an inorganic insulating material. The inorganic insulating material may include silicon oxide or silicon nitride.

A semiconductor layer SML is provided on the buffer layer BFL. The semiconductor layer SML includes the first to third source electrodes SE1 to SE3, the first to third drain electrodes DE1 to DE3, and the first to third active patterns ACT1 to ACT3 respectively provided between the source electrodes SE1 to SE3 and the drain electrodes DE1 to DE3.

A gate insulating layer GI may be disposed on the substrate SUB having the semiconductor layer formed thereon. The gate insulating layer GI may include any one insulating material selected from an inorganic insulating material including an inorganic substance and an organic insulating material including an organic substance.

The scan line SL, the first to third gate electrodes GE1 to GE3, and the third connection line CNL3 may be disposed on the gate insulating layer GI.

The second gate electrode GE2 may be integrally provided with the lower electrode of the storage capacitor Cst. That is, an expanded portion of the second gate electrode GE2 may become the lower electrode LE.

The third connection line CNL3 may be integrally provided with the third gate electrode GE3. That is, the third connection line CNL3 may become the third gate electrode GE3.

The first insulating layer IL1 is disposed on the substrate SUB on the scan line SL and the like are formed. The first insulating layer IL1 may be made of the same insulating material as the gate insulating layer GI, but the present disclosure is not limited thereto.

The upper electrode UE of the storage capacitor Cst is disposed on the first insulating layer ILL The upper electrode UE overlaps with the lower electrode LE with the first insulating layer IL1 interposed therebetween, thereby constituting the storage capacitor Cst.

A second insulating layer IL2 is disposed on the substrate SUB having the upper electrode UE formed thereon. The second insulating layer IL2 may be made of the same insulating material as the first insulating layer Ill, but the present disclosure is not limited thereto.

The data line DL, the power line PL, the emission control line EL, the first and second connection lines CNL1 and CNL2, and the bridge pattern BRP are disposed on the second insulating layer IL2.

The data line DL is connected to the first drain electrode DE1 through the first contact hole CH1 formed through the gate insulating layer GI and the first and second insulating layers IL1 and IL2.

The power line PL is connected to the third drain electrode DE3 through the eighth contact hole CH8 formed through the gate insulating layer GI and the first and second insulating layers IL1 and IL2.

The emission control line EL is connected to the third gate electrode GE3 through the seventh contact hole CH7 formed through the first and second insulating layers IL1 and IL2. Also, the emission control line EL is connected to the third blocking layer SDL3 through the sixth contact hole CH6 formed through the gate insulating layer GI, the first and second insulating layers IL1 and IL2, and the buffer layer BFL. Therefore, the third gate electrode GE3 and the third blocking layer SDL3 may be connected to each other.

The first connection line CNL1 is connected to the first gate electrode GE1 through the third contact hole CH3 formed through the first and second insulating layers IL1 and IL2. Also, the first connection line CNL1 is connected to the first blocking layer SDL1 through the fourth contact hole CH4 formed through the gate insulating layer GI, the first and second insulating layers IL1 and IL2, and the buffer layer BFL. Therefore, the first gate electrode GE1 and the first blocking layer SDL1 may be connected to each other.

The second connection line CNL2 is connected to the second source electrode SE2 through the ninth contact hole CH9 formed through the gate insulating layer GI and the first and second insulating layers IL1 and IL2. Also, the second connection line CNL2 is connected to the second blocking layer SDL2 through the tenth contact hole CH10 formed through the gate insulating layer GI, the first and second insulating layers IL1 and IL2, and the buffer layer BFL. Also, the second connection line CNL2 is connected to the upper electrode UE through the eleventh contact hole CH11 formed through the second insulating layer IL2. In addition, the second connection line CNL2 is connected to the anode electrode AD through the twelfth contact hole CH12. Therefore, the second source electrode SE2 may be connected to each of the second blocking layer SDL2 and the anode electrode AD. In addition, the upper electrode UE and the anode electrode AD may be connected to each other.

The bridge pattern BRP is connected to the first source electrode SE1 through the second contact hole CH2 formed through the gate insulating layer GI and the first and second insulating layers IL1 and IL2. Also, the bridge pattern BRP is connected to the second gate electrode GE2 through the fifth contact hole CH5 formed through the first and second insulating layers IL1 and IL2. Therefore, the first source electrode SE1 and the second gate electrode GE2 may be connected to each other.

A protective layer PSV is disposed on the substrate SUB on which the data line DL and the like are formed. The anode electrode AD is disposed on the protective layer PSV.

The anode electrode AD may be connected to the second connection line CNL2 through the twelfth contact hole CH12 formed through the protective layer PSV. Since the second connection line CNL2 is connected to the second source electrode SE2 through the ninth contact hole CH9 and is connected to the upper electrode UE through the tenth contact hole CH10, the anode electrode AD may be finally connected to the second source electrode SE2 and the upper electrode UE.

A pixel defining layer PDL that defines a pixel region to correspond to each pixel PXL may be provided on the substrate SUB having the anode electrode AD formed thereon. The pixel defining layer PDL exposes a top surface of the anode electrode AD, and may protrude from the substrate SUB along the circumference of the pixel PXL.

The emitting layer EML may be provide in the pixel region surrounded by the pixel defining layer PDL, and the cathode electrode CD may be provided on the emitting layer EML.

An encapsulation layer SLM that covers the cathode electrode CD may be provided over the cathode electrode CD.

According to the above-described embodiment, in each pixel PXL, the first to third blocking layers SDL1 to SDL3 partially overlapping with the respective first to third transistors T1 to T3 are disposed between the substrate SUB and the gate insulating layer GI, so that it is possible to prevent light incident through the back surface of the substrate SUB from reaching the first to third transistors T1 to T3. Accordingly, it is possible to prevent properties of the first to third transistors T1 to T3 from being deteriorated, thereby implementing a high-resolution display device.

Further, according to the above-described embodiment, as the second blocking layer SDL2 is connected to the second source electrode SE2 of the second transistor T2, the first transistor T1 is drain sync-operated during the first period a (reset period or initialization period), so that the initialization time can be reduced. In addition, the swing width margin of the second power source ELVSS is ensured, so that the driving range of the gate voltage applied to the second gate electrode GE2 can be widened.

FIGS. 7A to 7E are layout diagrams schematically illustrating components of the pixel shown in FIG. 5 for each layer.

First, referring to FIGS. 5 and 7A, first to third blocking layers SDL1 to SDL3 are provided on the substrate (see SUB of FIG. 6).

Referring to FIGS. 5 and 7B, a semiconductor layer SML partially overlapping with each of the first to third blocking layers SDL1 to SDL3 is provided with the buffer layer (see BFL of FIG. 6) interposed therebetween. The semiconductor layer SML may include first to third source electrodes SE1 to SE3, first to third drain electrodes DE1 to DE3, and first to third active patterns ACT1 to ACT3. The first to third source electrodes SE1 to SE3, the first to third drain electrodes DE1 to DE3, and the first to third active patterns ACT1 to ACT3 may be provided in the same layer and be formed through the same process.

Referring to FIGS. 5 to 7C, a scan line SL, a lower electrode LE, and a third connection line CNL3 are provided on the semiconductor layer (see SML of FIG. 7B) with the gate insulating layer (see GI of FIG. 6) interposed therebetween. The scan line SL, the lower electrode LE, and the third connection line CNL3 may be provided in the same layer and be formed through the same process.

A first gate electrode GE1 may be connected to the scan line SL. A second gate electrode GE2 may be connected to the lower electrode LE. A third gate electrode GE3 may be connected to the third connection line CNL3.

Referring to FIGS. 5 to 7D, an upper electrode UE is provided on the lower electrode LE with the first insulating layer (see IL1 of FIG. 6) interposed therebetween. The upper electrode UE may overlap with the lower electrode LE with the first insulating layer IL1 interposed therebetween, thereby constituting a storage capacitor Cst.

Referring to FIGS. 5 to 7E, a data line DL, a power line PL, an emission control line EL, first and second connection lines CNL1 and CNL2, and a bridge pattern BRP are provided on the upper electrode UE with the second insulating layer (see IL2 of FIG. 6) interposed therebetween.

The data line DL is connected to the first drain electrode DE1 through a first contact hole CH1. The power line PL is connected to the third drain electrode DE3 through an eighth contact hole CH8. The emission control line EL is connected to the third connection line CNL3 through a seventh contact hole CH7, and is connected to the third blocking layer SDL3 through a sixth contact hole CH6.

The first connection line CNL1 connects the first gate electrode GE1 and the first blocking layer SDL1 through third and fourth contact holes CH3 and CH4.

The second connection line CNL2 connects the second source electrode SE2, the upper electrode UE, and the anode electrode (see AD of FIG. 5) through a ninth contact hole CH9, an eleventh contact hole CH11, and a twelfth contact hole CH12. Also, the second connection line CNL2 connects the second blocking layer SDL2 and the second source electrode through a tenth contact hole CH10.

The bridge pattern BRP is connected to the first source electrode SE1 through a second contact hole CH2, and is connected to the second gate electrode GE2 through a fifth contact hole CH5. Therefore, the first source electrode SE1 and the second gate electrode GE2 may be connected to each other.

Figure 8:
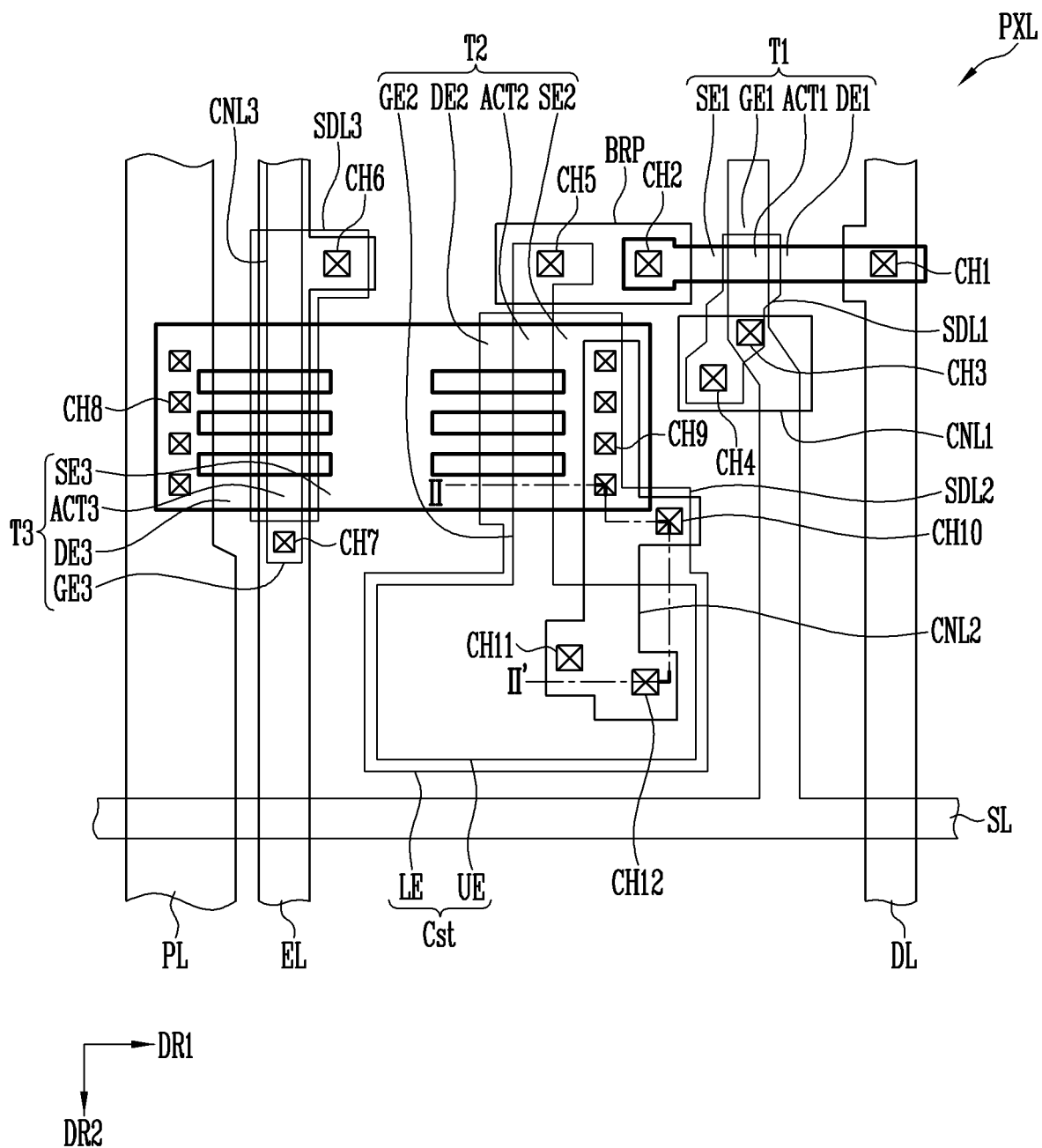
FIG. 8 is a plan view implementing the pixel of FIG. 2 according to another embodiment of the inventive concept.

FIG. 8 is a plan view implementing the pixel of FIG. 2 according to another embodiment of the inventive concept. FIG. 9 is a sectional view taken along line II-IT of FIG. 8. In a display device including the pixel implemented as another embodiment of the present disclosure, differences from the display device according to the above-described embodiment will be mainly described to avoid redundancy. Portions not particularly described in the another embodiment of the present disclosure follow those of the display device according to the above-described embodiment. In addition, identical reference numerals refer to identical components, and similar reference numerals refer to similar components.

Referring to FIGS. 2, 8, and 9, the display device according to the another embodiment of the present disclosure includes a substrate SUB, signal lines, and pixels PXL.

The signal lines provide signals to each pixel, and includes a scan line SL, a data line DL, an emission control line EL, and a power line PL.

Each pixel PXL includes first to third transistors T1 to T3, a storage capacitor Cst, a light emitting element OLED, a bridge pattern BRP, first to third connection lines CNL1 to CNL3, and first to third blocking layers SDL1 to SDL3.

The first to third blocking layers SDL1 to SDL3 are disposed on the substrate SUB. The first blocking layer SDL1 may partially overlap with a first active pattern ACT1 of the first transistor T1 when viewed on a plane. The second blocking layer SDL2 may partially overlap with a second active pattern ACT2 of the second transistor T2 when viewed on a plane. The third blocking layer SDL3 may partially overlap with a third active pattern ACT3 of the third transistor T3 when viewed on a plane. As the first to third blocking layers SDL1 to SDL3 completely cover the first to third active patterns ACT1 to ACT3, respectively, it is possible to block light incident through the back surface of the substrate SUB from reaching the first to third active patterns ACT1 to ACT3.

The first transistor T1 includes a first gate electrode GE1, the first active pattern ACT1, a first source electrode SE1, and a first drain electrode DEL The first gate electrode GE1 may be connected to the first blocking layer SDL1 through the first connection line CNL1.

The second transistor T2 includes a second gate electrode GE2, the second active pattern ACT2, a second source electrode SE2, and a second drain electrode DE2. The second source electrode SE2 may be connected to the second blocking layer SDL2 through the second connection line CNL2.

The third transistor T3 includes a third gate electrode GE3, the third active pattern ACT3, a third source electrode SE3, and a third drain electrode DE3. The third gate electrode GE3 may be connected to the third blocking layer SDL3 through the emission control line EL and the third connection line CNL3.

The storage capacitor Cst includes a lower electrode LE and an upper electrode UE. The lower electrode LE of the storage capacitor Cst may be provided as the second blocking layer SDL2. The upper electrode UE of the storage capacitor Cst may be provided as the second gate electrode GE2 of the second transistor T2. The overlapping area of the upper electrode UE and the lower electrode LE is widened, so that the capacitance of the storage capacitor Cst can be increased.

The light emitting element OLED may include an anode electrode AD, a cathode electrode CD, and an emitting layer EML disposed between the anode electrode AD and the cathode electrode CD.

Again, a structure of the display device according to the another embodiment of the present disclosure will be described along a stacking order with reference to FIGS. 2, 8, and 9.

First, the first to third blocking layers SDL1 to SDL3 may be disposed on the substrate SUB. The second blocking layer SDL2 may be integrally provided with the lower electrode LE of the storage capacitor Cst. That is, an expanded portion of the second blocking layer SDL2 may become the lower electrode LE.

Subsequently, a buffer layer BFL may be provided over the first to third blocking layers SDL1 to SDL3 and the lower electrode LE.

A semiconductor layer may be disposed on the buffer layer BFL. The semiconductor layer includes the first to third source electrodes SE1 to SE3, the first to third drain electrodes DE1 to DE3, and the first to third active patterns ACT1 to ACT3 respectively provided between the source electrodes SE1 to SE3 and the drain electrode DE1 to DE3.

A gate insulating layer GI may be disposed on the substrate SUB having the semiconductor layer formed thereon.

The scan line SL, the first to third gate electrodes GE1 to GE3, and the third connection line CNL3 may be disposed on the gate insulating layer GI. The second gate electrode GE2 may be integrally provided with the upper electrode UE of the storage capacitor Cst. That is, an expanded portion of the second gate electrode GE2 may become the upper electrode UE.

The first gate electrode GE1 may be integrally provided with the scan line SL and be provided on the first active pattern ACT1, to be used as an anti-doping layer that allows the first active pattern ACT1 not to be doped with an impurity. Accordingly, the first gate electrode GE1 can define a channel region of the first active pattern ACT1.

The second gate electrode GE2 may be used as the upper electrode UE of the storage capacitor Cst and be disposed on the second active pattern ACT2, to be used as an anti-doping layer that allows the second active pattern ACT2 not to be doped with the impurity. Accordingly, the second gate electrode GE2 can define a channel region of the second active pattern ACT2.

The upper electrode UE may overlap with the lower electrode LE with the gate insulating layer GI and the buffer layer BFL interposed therebetween to constitute the storage capacitor Cst.

The third gate electrode GE3 may be used as the third connection line CNL3 and be provided on the third active layer ACT3, to be used as an anti-doping layer that allows the third active pattern ACT3 not to be doped with the impurity. Accordingly, the third gate electrode GE3 can define a channel region of the third active pattern ACT3.

The third connection line CNL3 may be integrally provided with the third gate electrode GE3. That is, the third connection line CNL3 may become the third gate electrode GE3.

First and second insulating layers IL1 and IL2 may be disposed on the substrate SUB on which the scan line SL, the first to third gate electrodes GE1 to GE3, the third connection line CNL3, and the upper electrode UE are formed.

The data line DL, the power line PL, the emission control line EL, the first and second connection lines CNL1 and CNL2, and the bridge pattern BRP may be disposed on the second insulating layer IL2.

A protective layer PSV may be disposed on the substrate SUB on the data line DL and the like are formed.

The anode electrode AD may be disposed on the protective layer PSV. The anode electrode AD may be connected to the second connection line CNL2 through a twelfth contact hole CH12 formed through the protective layer PSV. The anode electrode AD may be finally connected to the second source electrode SE2 and the upper electrode UE.

A pixel defining layer PDL may be disposed on the substrate SUB having the anode electrode AD formed thereon, the emitting layer EML may be provided in a pixel region surrounded by the pixel defining layer PDL, and the cathode electrode CD may be provided on the emitting layer EML.

An encapsulation layer SML that covers the cathode electrode CD may be provided over the cathode electrode CD.

According to the above-described embodiment, in each pixel PXL, the first to third blocking layers SDL1 to SDL3 partially overlapping with the respective first to third transistors T1 to T3 are disposed between the substrate SUB and the buffer layer BFL, so that it is possible to prevent light incident through the back surface of the substrate SUB from reaching the first to third transistors T1 to T3.

Further, according to the above-described embodiment, the second blocking layer SDL2 is used as the lower electrode LE of the storage capacitor Cst, and the second gate electrode GE2 is used as the upper electrode UE of the storage capacitor Cst, so that some of the layers provided on the substrate SUB can be omitted. Accordingly, the manufacturing process of the display device can be simplified, and the manufacturing cost of the display device can be reduced.

FIGS. 10A to 10D are layout diagrams schematically illustrating components of the pixel shown in FIG. 8 for each layer.

Figure 10A:
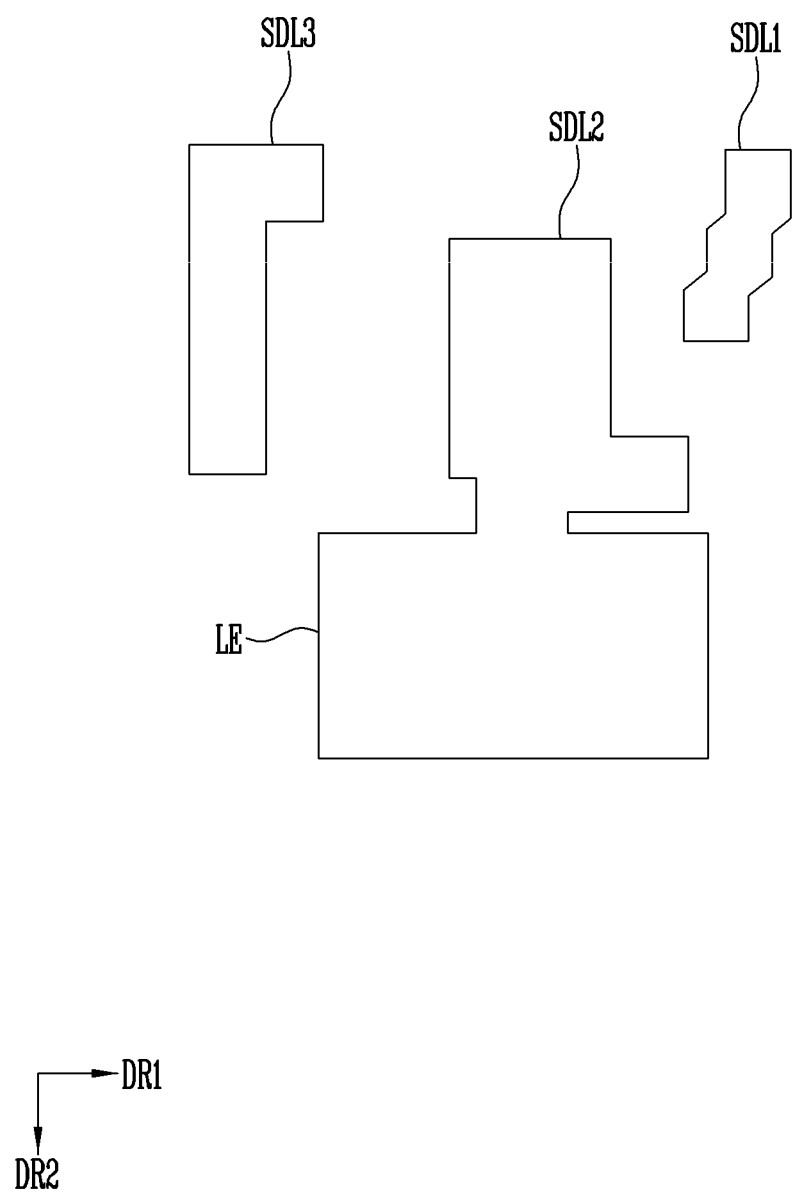

First, referring to FIGS. 8 and 10A, first to third blocking layers SDL1 to SDL3 are disposed on the substrate (see SUB of FIG. 9). Here, a lower electrode LE of a storage capacitor Cst may be provided with the second blocking layer SDL2.

Referring to FIGS. 8 and 10B, a semiconductor layer SML partially overlapping with the respective first to third blocking layers SDL1 to SDL3 is provided on the buffer layer (see BFL of FIG. 9). The semiconductor layer SML may include first to third source electrodes SE1 to SE3, first to third drain electrodes DE1 to DE3, and first to third active patterns ACT1 to ACT3.

Figure 10C:
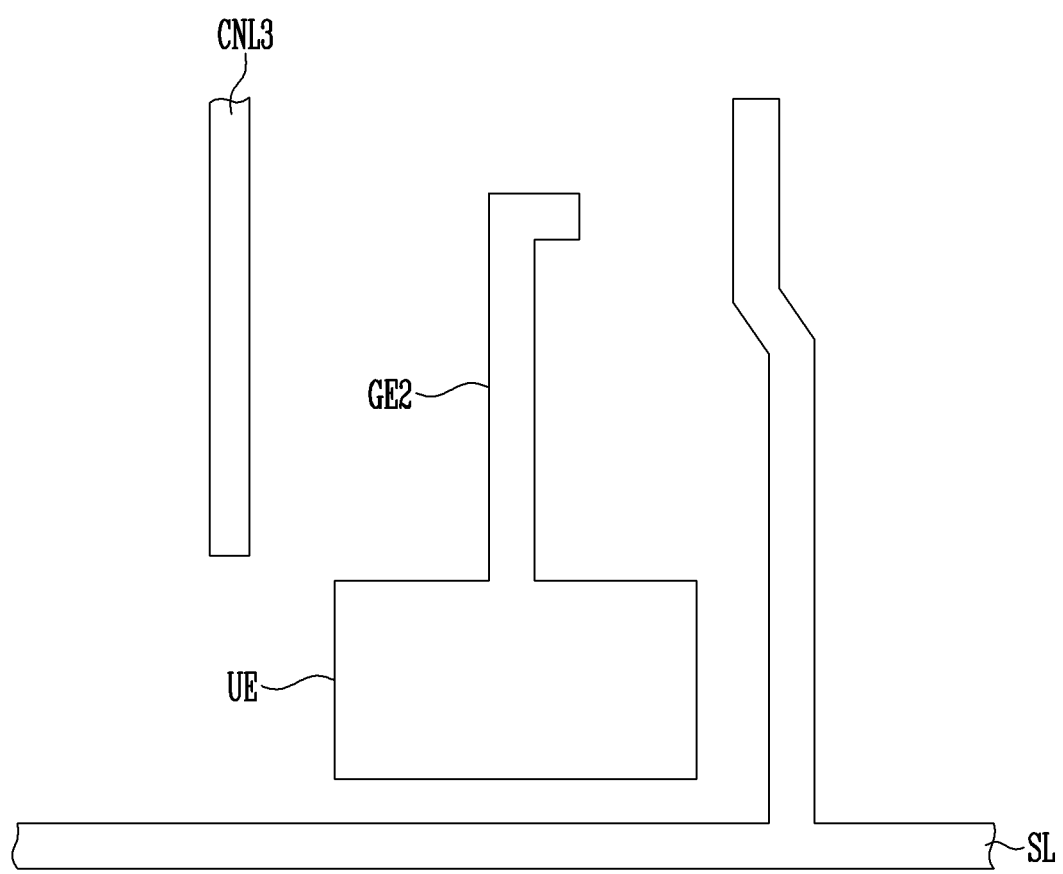

Referring to FIGS. 8 and 10C, a scan line SL, a third connection line CNL3, and a second gate electrode GE2 are disposed on the semiconductor layer (see SML of FIG. 10) on the gate insulating layer (see GI of FIG. 9).

A first gate electrode GE1 may be connected to the scan line SL. A third gate electrode GE3 may be connected to the third connection line CNL3. The second gate electrode GE2 may be integrally provided with an upper electrode UE of the storage capacitor Cst.

Figure 10D:
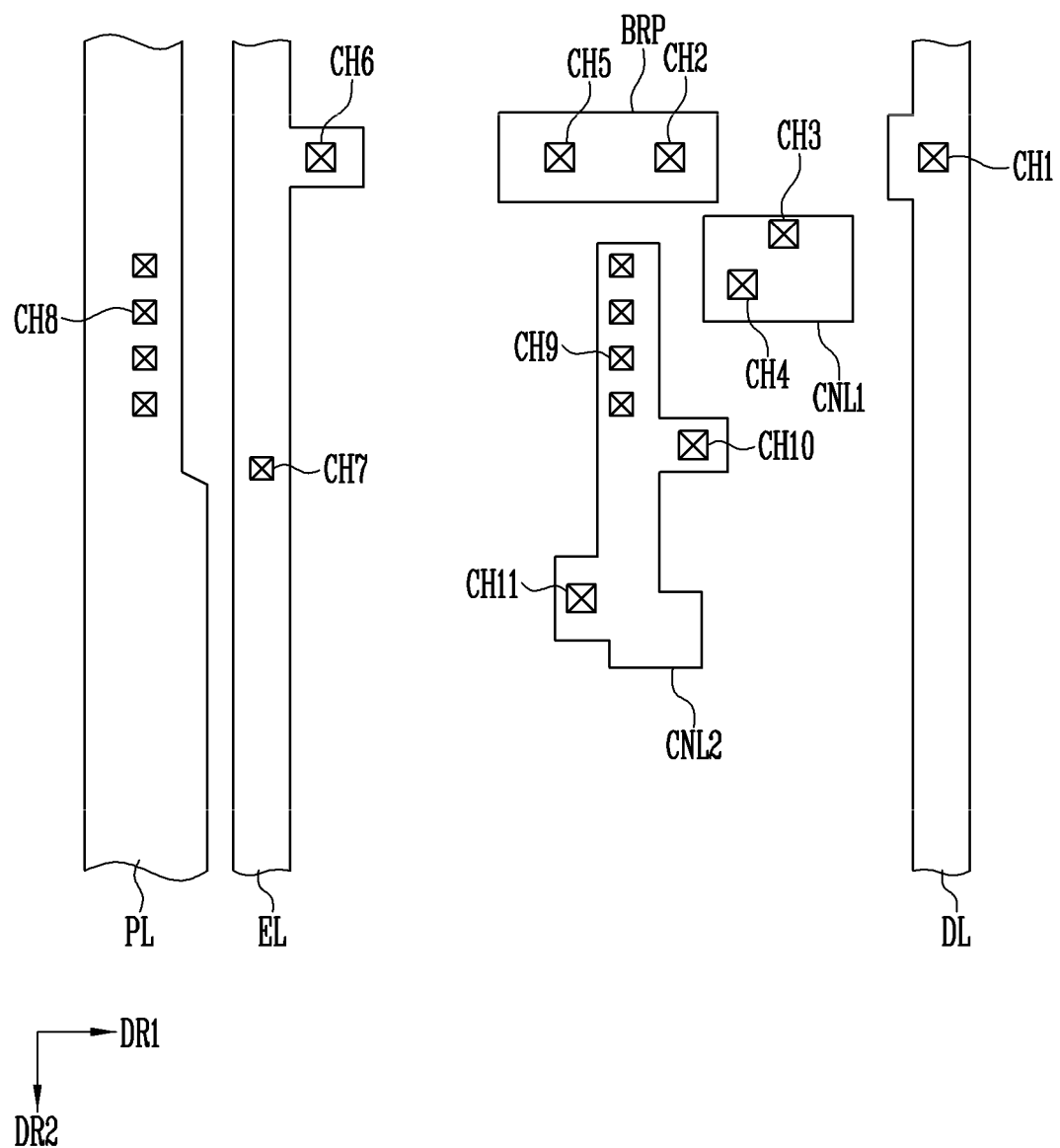

Referring to FIGS. 8 and 10D, a data line DL, a power line PL, an emission control line EL, first and second connection lines CNL1 and CNL2, and a bridge pattern BRP are disposed on the scan line SL, the third connection line CNL3, and the first to third gate electrodes GE1 to GE3 with the first and second insulating layers (see IL1 and IL2 of FIG. 9) interposed therebetween.

The data line DL is connected to the first drain electrode DE1 through a first contact hole CH1. The power line PL is connected to the third drain electrode DE3 through an eighth contact hole CH8. The emission control line EL is connected to the third gate electrode GE3 integrally provided with the third connection line CNL3 through a seventh contact hole CH7, and is connected to the third blocking layer SDL3 through a sixth contact hole CH6. Therefore, the third gate electrode GE3 and the third blocking layer SDL3 may be connected to each other.

The first connection line CNL1 is connected to the first gate electrode GE1 through a third contact hole CH3, and is connected to the first blocking layer SDL1 through a fourth contact hole CH4. Therefore, the first gate electrode GE1 and the first blocking layer SDL1 may be connected to each other.

The second connection line CNL2 is connected to the second source electrode SE2 through a ninth contact hole CH9, is connected to the upper electrode UE through an eleventh contact hole CH11, and is connected to the anode electrode (see AD of FIG. 9) through a twelfth contact hole CH12. Also, the second connection line CNL2 is connected to the second blocking layer SDL2 through a tenth contact hole CH10. Therefore, the second source electrode SE2 and the second blocking layer SDL2 may be connected to each other.

The bridge pattern BRP is connected to the first source electrode SE1 through a second contact hole CH2, and is connected to the second gate electrode GE2 through a fifth contact hole CH5. Therefore, the first source electrode SE1 and the second gate electrode GE2 may be connected to each other.

The display device according to the present disclosure can be employed in various electronic devices. For example, the display device is applicable to televisions, notebook computers, cellular phones, smart phones, smart pads, PMPs, PDAs, navigations, various wearable devices such as smart watches, and the like.

According to the present disclosure, it is possible to provide a display device which implements high resolution.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A display device, comprising:
    a substrate including a pixel region and a peripheral region;
    a plurality of pixels provided in the pixel region, each of the plurality of pixels including a first transistor and a second transistor;
    a scan line and a data line spaced apart from each other and crossing each other;
    a light emitting element connected to at least one of the first and second transistors;
    a first blocking layer disposed on the substrate and electrically connected to the first transistor; and
    a second blocking layer disposed on the substrate and electrically connected to the second transistor,
    wherein each of the first and second transistors includes an active pattern, a gate electrode on the active pattern, and source and drain electrodes each connected to the active pattern, and
    wherein a configuration of the first transistor electrically connected to the first blocking layer and a configuration of the second transistor electrically connected to the second blocking layer are different from each other.

2. The display device of claim 1, wherein the first blocking layer is connected to the gate electrode of the first transistor, and the second blocking layer is connected to any one of the source and drain electrodes of the second transistor.

3. The display device of claim 2, wherein:
    the first transistor is connected to the scan line and the data line and supplies a data signal to a first node, and
    the second transistor is connected to the first transistor and supplies a current corresponding to a voltage applied to the first node from a first power source to a second power source via the light emitting element.

4. The display device of claim 2, wherein the first blocking layer is disposed between the substrate and the first transistor, and the second blocking layer is disposed between the substrate and the second transistor.

5. The display device of claim 4, wherein the first blocking layer and the second blocking layer are provided on a same layer.

6. The display device of claim 5, wherein, when viewed on a plane, the first blocking layer overlaps with a portion of the first transistor, and the second blocking layer overlaps with a portion of the second transistor.

7. The display device of claim 6, further comprising:
a buffer layer disposed between the second blocking layer and the active pattern of the second transistor, and
a gate insulating layer, a first insulating layer, and a second insulating layer, sequentially disposed on the buffer layer.

8. The display device of claim 7, further comprising:
a lower electrode disposed on the gate insulating layer; and
an upper electrode disposed on the first insulating layer,
wherein the lower electrode and the upper electrode constitute a storage capacitor with the first insulating layer interposed therebetween.

9. The display device of claim 8, wherein the second blocking layer is integrally provided with the lower electrode.

10. The display device of claim 7, further comprising:
an emission control line disposed on the second insulating layer;
a third transistor connected to the emission control line and the second transistor; and
a third blocking layer connected to the third transistor.

11. The display device of claim 10, wherein the third transistor includes:
an active pattern disposed on the substrate;
a gate electrode disposed on the active pattern; and
source and drain electrodes, each connected to the active pattern, and
wherein the gate electrode is electrically connected to the third blocking layer.

12. The display device of claim 11, wherein, when viewed on a plane, the third blocking layer overlaps with a portion of the second transistor.

13. The display device of claim 11, wherein the third blocking layer is provided on the same layer as the first and second blocking layers.

14. A display device, comprising:
a first transistor connected to a data line and a scan line to supply a data signal to a first node;
a storage capacitor having one electrode connected to the first node and the other electrode connected to a second node;
a light emitting element having one electrode connected to the second node and the other electrode connected to a second power source;
a second transistor supplying a current corresponding to a voltage applied to the first node from a first power source to the second power source via the light emitting element;
a third transistor connected to the second transistor and an emission control line;
a first blocking layer electrically connected to the first transistor;
a second blocking layer electrically connected to the second transistor; and
a third blocking layer electrically connected to the third transistor,
wherein each of the first to third transistors includes an active pattern, a gate electrode on the active pattern, and source and drain electrodes each connected to the active pattern, and
wherein a configuration of the first transistor connected to the first blocking layer and a configuration of the third transistor connected to the third blocking layer are the same.

15. The display device of claim 14, wherein at least one of the first to third blocking layers is connected to the source electrode of the second transistor, and the other of the first to third blocking layers is connected to the gate electrode of the corresponding transistor.

16. The display device of claim 15, wherein the first blocking layer is connected to the gate electrode of the first transistor, and the third blocking layer is connected to the gate electrode of the third transistor.

17. The display device of claim 15, wherein the second blocking layer is connected to the source electrode of the second transistor.

18. The display device of claim 15, wherein the first to third blocking layers are provided on a same layer.

19. The display device of claim 15, wherein, when viewed on a plane, the first blocking layer overlaps with a portion of the first transistor, the second blocking layer overlaps with a portion of the second transistor, and the third blocking layer overlaps with a portion of the third transistor.

* * * * *